(12) United States Patent
Ahmed et al.

(10) Patent No.: US 6,442,090 B1
(45) Date of Patent: Aug. 27, 2002

(54) DIFFERENTIAL SENSING AMPLIFIER FOR CONTENT ADDRESSABLE MEMORY

(75) Inventors: Abdullah Ahmed, Scarborough; Jin Ki Kim, Kanata, both of (CA)

(73) Assignee: Mosaid Technologies Inc., Kanata (CA)

( * ) Notice: Subject to any disclaimer, the term of this patent is extended or adjusted under 35 U.S.C. 154(b) by 0 days.

(21) Appl. No.: 09/563,070

(22) Filed: Apr. 24, 2000

(30) Foreign Application Priority Data

Jun. 7, 1999 (CA) .............................. 2273665

(51) Int. Cl.[7] ................................ G11C 7/02
(52) U.S. Cl. ........................ 365/207; 365/49
(58) Field of Search ............... 327/51, 52, 55, 327/56, 57; 365/49, 207

(56) References Cited

U.S. PATENT DOCUMENTS

| | | | |
|---|---|---|---|
| 4,763,026 A | 8/1988 | Tsen et al. ................ 307/530 |
| 5,012,448 A | 4/1991 | Matsuoka et al. ......... 365/208 |
| 5,051,948 A | * 9/1991 | Watabe et al. ............. 365/49 |
| 5,287,314 A | 2/1994 | Flannagan et al. ........ 365/208 |
| 5,299,147 A | 3/1994 | Holst ......................... 365/49 |
| 5,525,919 A | 6/1996 | Phelan ....................... 327/52 |
| 5,532,623 A | 7/1996 | Advani et al. ............. 327/51 |
| 5,550,511 A | 8/1996 | Miyashita ................. 330/253 |
| 5,610,573 A | 3/1997 | Priebe ..................... 340/146.2 |
| 5,646,878 A | 7/1997 | Samra ........................ 365/49 |
| 5,684,750 A | 11/1997 | Kondoh et al. ........... 365/205 |
| 5,748,070 A | 5/1998 | Priebe et al. ............ 340/146.2 |
| 5,801,586 A | 9/1998 | Ishizuka ................... 327/545 |
| 5,894,233 A | 4/1999 | Yoon .......................... 327/55 |
| 6,054,918 A | * 4/2000 | Holst ...................... 340/146.2 |

* cited by examiner

Primary Examiner—M. Tran
(74) Attorney, Agent, or Firm—Price, Heneveld, Cooper, DeWitt & Litton

(57) ABSTRACT

A differential sensing amplifier for content addressable memory is disclosed. In the differential sensing amplifier there is a detection circuit for detecting at an input node a change in an input signal comprising, a differential amplifier having a sense node and a reference node, a means for alternating the differential amplifier between a precharge phase and a sense phase, a precharge means for providing an input signal precharge voltage to the input signal via an input device, said input device selectively coupling the sense node to the input signal upon a change in the input signal, and a reference means for providing the reference node with a reference signal that continuously tracks the input precharge voltage during the precharge phase and actively maintains the input signal precharge voltage during the sense phase. In a specifically preferred embodiment the invention provides a sensing amplifier circuit for detecting a match or mismatch search condition on a high density content addressable memory matchline that is capable of rapidly sensing the capacitive matchline, limiting the matchline voltage swing sensing all matchlines simultaneously, and providing the match and mismatch result for post processing, all under relatively low dynamic power while consuming little circuit area.

40 Claims, 8 Drawing Sheets

DIFFERENTIAL SENSING AMPLIFIER FOR CONTENT ADDRESSABLE MEMORY

FIELD OF INVENTION

The present invention generally relates to semiconductor memory devices and more specifically to the sensing of matchlines of a high-density Content Addressable Memory (CAM) system.

DESCRIPTION OF THE BACKGROUND ART

In general, a semiconductor memory circuit typically consists of an array of rows and columns. Each intersection of a row and column defines a memory "cell" that stores either a binary logic "1" or a "0".

There are many types of memory available for various storage applications. For retrieval processing of large amounts of data, an associative memory called Content Addressable Memory (CAM) is gaining widespread use in a variety of applications including data networking. The important feature of CAM is that it can perform a search and compare operation between specified user data and stored data and return match or mismatch results.

CAM arrays are also made up of intersections of rows and columns of CAM cells, as with most typical memories. In addition to rows and columns of cells, associated with each row of CAM cells is a matchline and a matchline detection circuit or sense amplifier that senses the changes in the logic state of a matchline for the cells in that row. The matchline sense amplifier detects a match or a mismatch during a CAM search and compare operation. FIG. 4 illustrates a block diagram of a typical array of memory cells where the detection circuit DC is used to sense a match or mismatch on the matchline ML connected to a row of several CAM cells.

Conventionally, during matchline sensing, there is no reference level available to compare a matchline to be sensed, the selected matchline ML either remains at a precharged voltage (VDD, for example) for a match detection, or discharges (towards ground voltage VSS, for example) for a mismatch detection. A match or mismatch condition must be detected for each cell in a bit search operation, and every matchline ML must be sensed simultaneously with typically 32,000 other matchlines or more. Since matchlines typically discharge from the precharged voltage in the case of a mismatch in any bit, and statistically, mismatches are much more frequent than matches, dynamic power due to matchlines switching simultaneously becomes a significant factor in designing the CAM which has to be accounted for.

Moreover, in high-density memory systems where the number of CAM cells in each row can reach 128 or higher, the speed for discharging a matchline is virtually limited by the capacitance of the matchline. This inherent discharge limitation cannot cope with the fast switching speed of high-density CAM systems where the search cycle time is of the order of 15 ns.

A sensing scheme is therefore required that will limit the matchline voltage swing in order to reduce the dynamic power of sensing all the matchlines while allowing for high speed search operations under low power consumption.

There are several known approaches to designing match/mismatch detection circuits. FIG. 1 shows a prior art example for sensing a matchine as disclosed in U.S. Pat. No. 5,051,948 by Watabe et al. In this sensing scheme, a current-voltage conversion circuit is first used to convert the matchline current into a voltage value. This voltage is then sensed by a voltage sensing circuit using a dummy reference voltage. This design may not be suitable for high-density CAM systems for the following reasons:

a. the current to voltage conversion is performed by a CMOS inverter that is biased as an analog amplifier. Under this arrangement, DC power is constantly consumed during entire operation and such consumption of power would be well beyond the limits that a high-density integrated circuit package could handle;

b. The dummy reference voltage circuit also uses CMOS inverters as an analog amplifier. This scheme not only consumes DC power but also precludes the appropriate tracking of the reference voltage with that of the matchline under high-speed, high-density memory sensing conditions; and c. The circuit blocks of this type of design consume a considerable amount of integrated circuit area.

In summary, the inhibiting characteristics of this prior art design, when applied to high-density CAM systems, are both power and area consumption.

FIG. 2 shows a second prior art circuit, as disclosed in U.S. Pat No. 5,012,448, utilized in a Read-only-Memory (ROM) multilevel memory. This sensing scheme incorporates two CMOS inverters that operate as small-signal amplifiers each connected to NMOS devices for current sensing. The sources of both the reference side NMOS and the matchline side NMOS are fed into a current mirror circuit. As in the first prior art discussed, this second prior art approach may not be suitable for high-density memory applications because of the unacceptably large dissipation of power. In addition, due to the current mirror arrangement, a full CMOS level swing cannot be efficiently achieved.

A third prior art design is disclosed in U.S. Pat. No. 4,763,026 for single-ended data sensing. As illustrated in FIG. 3, this approach generates a reference voltage from the dataline itself. However, a key disadvantage of this prior art approach is that the reference node VREF is allowed to float after being precharged. Based on the high capacitive load T14, the precharged voltage value of VREF is expected to remain at the same level during the sensing operation. The reliance on a high capacitive load to hold the precharged value of the reference node may not be appropriate because, in a VLSI interchip environment, high noise injections from high speed operations can corrupt the value of the capacitive load and cause an unintended reversal in operation. A second disadvantage of this prior art design is that such a large dummy capacitance requires an appreciably large area on the VLSI chip. This may be cumbersome and impractical for a high-density CAM arrangement where 32,000 or more matchline sense amplifiers are required.

In summary, there is clearly a need for matchline sense amplifiers that are capable of:

quickly sensing a (highly capacitive) matchline;

limiting the matchline swing; and sense all matchlines simultaneously (32K and above), but in a manner which reduces the portion of integrated chip area used for high-density memory applications and reduces heat dissipation.

SUMMARY OF THE INVENTION

The above identified disadvantages of the prior art are now overcome with a sensing amplifier circuit operating under low dynamic power.

It is an object of the present invention to provide a sensing amplifier circuit for detecting a change in an input signal at an input node under relatively low dynamic power while consuming relatively little integrated circuit area. In a specifically preferred embodiment the invention provides a sensing amplifier circuit for detecting a match or mismatch search condition on a high density content addressable memory matchline that is capable of:

rapidly sensing the capacitive matchline;

limiting the matchline voltage swing; and sensing all matchlines simultaneously providing the match and mismatch result for post processing under relatively low dynamic power while consuming little circuit area.

It is a further objective of the content addressable memory application of the present invention to provide a sensing amplifier circuit wherein a sense node to a differential amplifier is not allowed to float to an unknown voltage level during the sense phase in case of a match and is not affected by noise injection on the matchline from high-speed operation.

It is yet another objective of the content addressable memory application of the present invention to provide a sensing amplifier circuit wherein a reference node on the differential amplifier is:

allowed to self-track the matchline voltage level (including any variation thereof due to device mismatches or threshold changes) during the precharge phase and maintain this precharge level during the sense phase; and not allowed to float after the precharge phase, thus ensuring that noise coupling does not corrupt the reference node during the sensing phase.

Therefore, in accordance with one aspect of the present invention, there is provided a detection circuit for detecting at an input node a change in an input signal comprised of four elements. The first element is a differential amplifier having a sense node and a reference node. The second element is a means for alternating the differential amplifier between a precharge phase and a sense phase. The third elements is a precharge means for providing an input signal precharge voltage to the input signal via an input device, said input device selectively coupling the sense node to the input signal upon a change in the input signal. The fourth element is a reference means for providing the reference node with a reference signal that continuously tracks the input precharge voltage during the precharge phase and actively maintains the input signal precharge voltage during the sense phase. These elements comprise an aspect of the invention wherein the detection circuit detects a change in the input signal during the sense phase by comparing signals on the sense and reference nodes.

In an embodiment of the invention a detection circuit as defined above, for detecting a match or mismatch search condition on a high density content addressable memory matchline wherein the input signal is derived from the matchline.

In accordance with another aspect of the invention, there is provided a method of detecting a change in an input signal comprised of five steps. The first step is to precharge he input signal to an input signal precharge level. The second step is to generate a reference signal that continuously tracks the input signal precharge level during a precharge phase, and actively maintaining the reference signal at the input signal precharge level during a sense phase. The third step is to derive a sense signal corresponding to the input signal during the sense phase. The fourth step is to compare the sense signal with the reference signal. The fifth step is to switch an output signal between a first state and a second state upon said change.

In accordance with another aspect of the invention, there is provided a precharge circuit for precharging a matchline within an array of CAM cells powered from first and second power supply terminals, having a predetermined first supply voltage at the first power supply terminal relative to the second power supply terminal, comprised of two elements. The first element is an input device positioned between the matchline and a sense node. The second element is a precharge device for coupling the sense node to the first power supply terminal during a precharge phase, wherein an state of the input device is reversed upon the matchline reaching a voltage lower than or equal to a pre-selected precharge voltage, and wherein the precharge voltage is lower than the first power supply voltage, all voltages being in absolute values relative to the second power supply terminal. In accordance with another aspect of the invention, there is provided a method of precharging a matchline during a precharge phase within an array of CAM cells comprised of two steps. The first step is to begin to precharge the matchline by coupling the matchline to a first power supply terminal via an input device. The second step is to decouple the matchline from the first power supply terminal, when the matchline reaches a pre-selected precharge voltage.

In accordance with another aspect of the invention, there is provided a detection circuit for detecting a match or mismatch search condition on a dynamic content addressable memory matchline comprised of three elements. The first element is a precharge means for precharging the matchline to a predetermined matchline precharge voltage during a precharge phase. The second element is a reference means for generating a reference voltage which tracks the matchline precharge voltage during the precharge phase and actively maintains the matchline precharge voltage during a sense phase. The third element is a differential amplifier for sensing a voltage difference between the reference voltage at a reference node and a sense node voltage at a sense node selectively coupled to the matchline via an input circuit during the sense phase.

In accordance with another aspect of the invention, there is provided a detection circuit for detecting a change on an input signal comprised of three elements. The first element is a precharge means for precharging the input signal to a pre-selected precharge voltage during a precharge phase. The second element is a reference means for generating a reference voltage on a reference node which tracks the precharge voltage during the precharge phase and actively maintains the precharge voltage level during a sense phase. The third element is a differential amplifier for sensing a voltage difference between the reference voltage and a sense node voltage coupled to the input signal.

BRIEF DESCRIPTION OF DRAWINGS

Exemplary embodiments of the invention will now be further described with references to the drawings wherein.

DETAILED DESCRIPTION OF THE INVENTION

Figure 1:
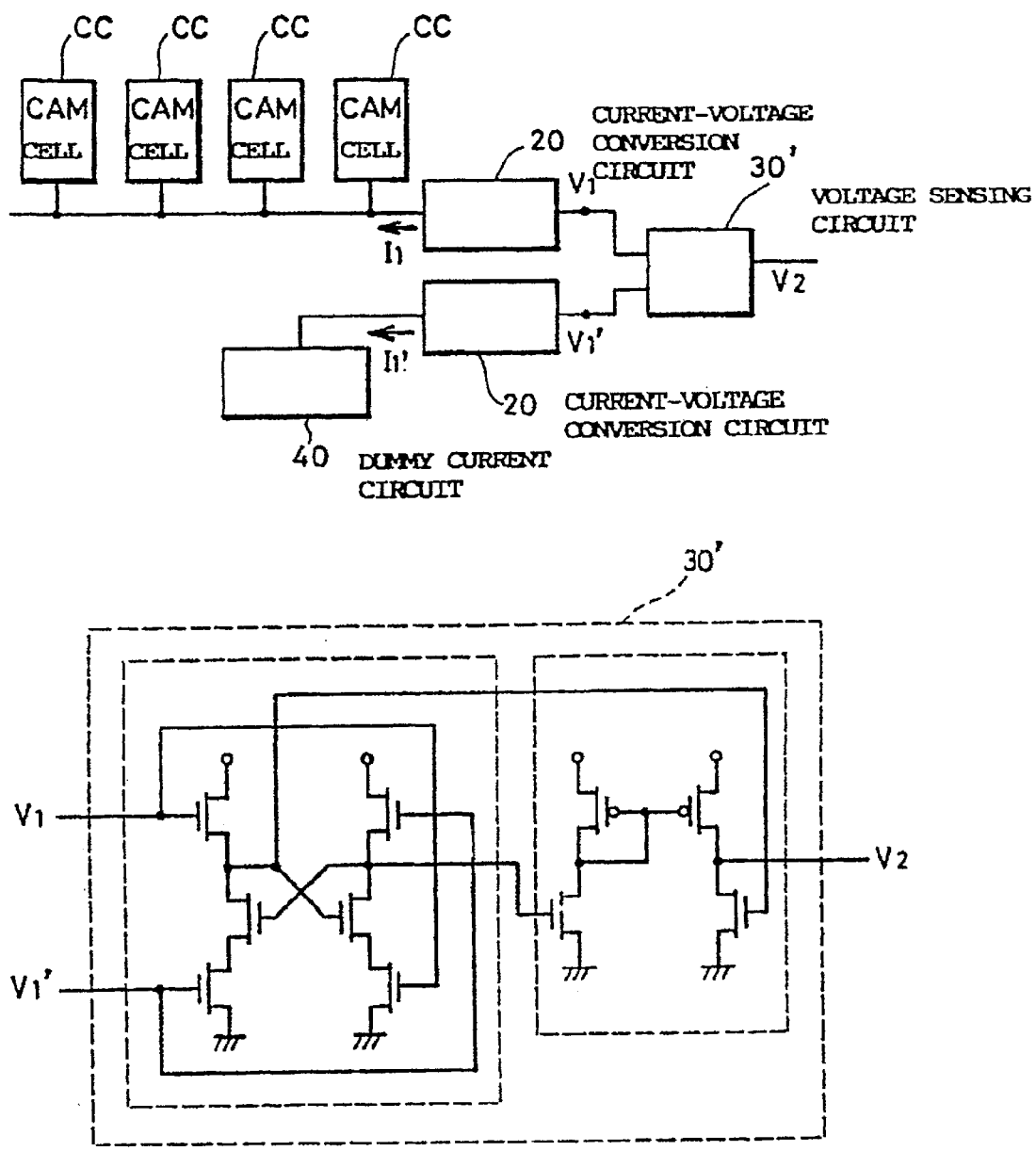
FIG. 1 illustrates a prior art sensing circuit used in a content addressable memory.
Figure 2:
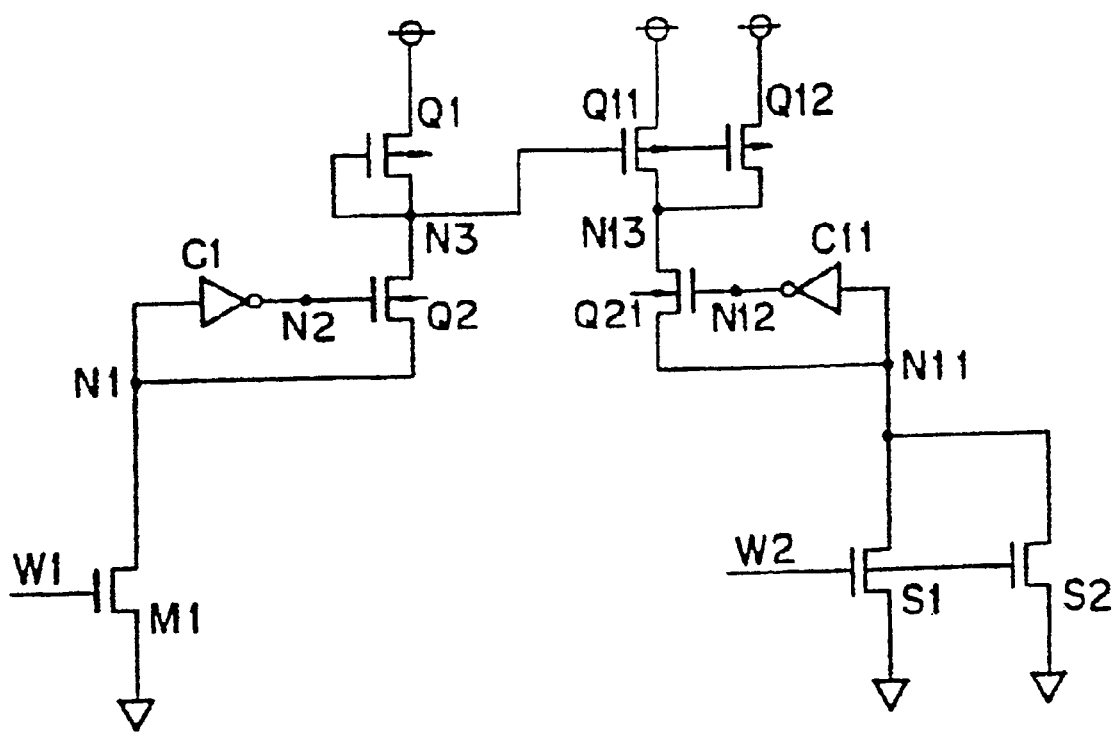
FIG. 2 illustrates a prior art sensing circuit of the type used in a ROM multilevel memory.
Figure 3:
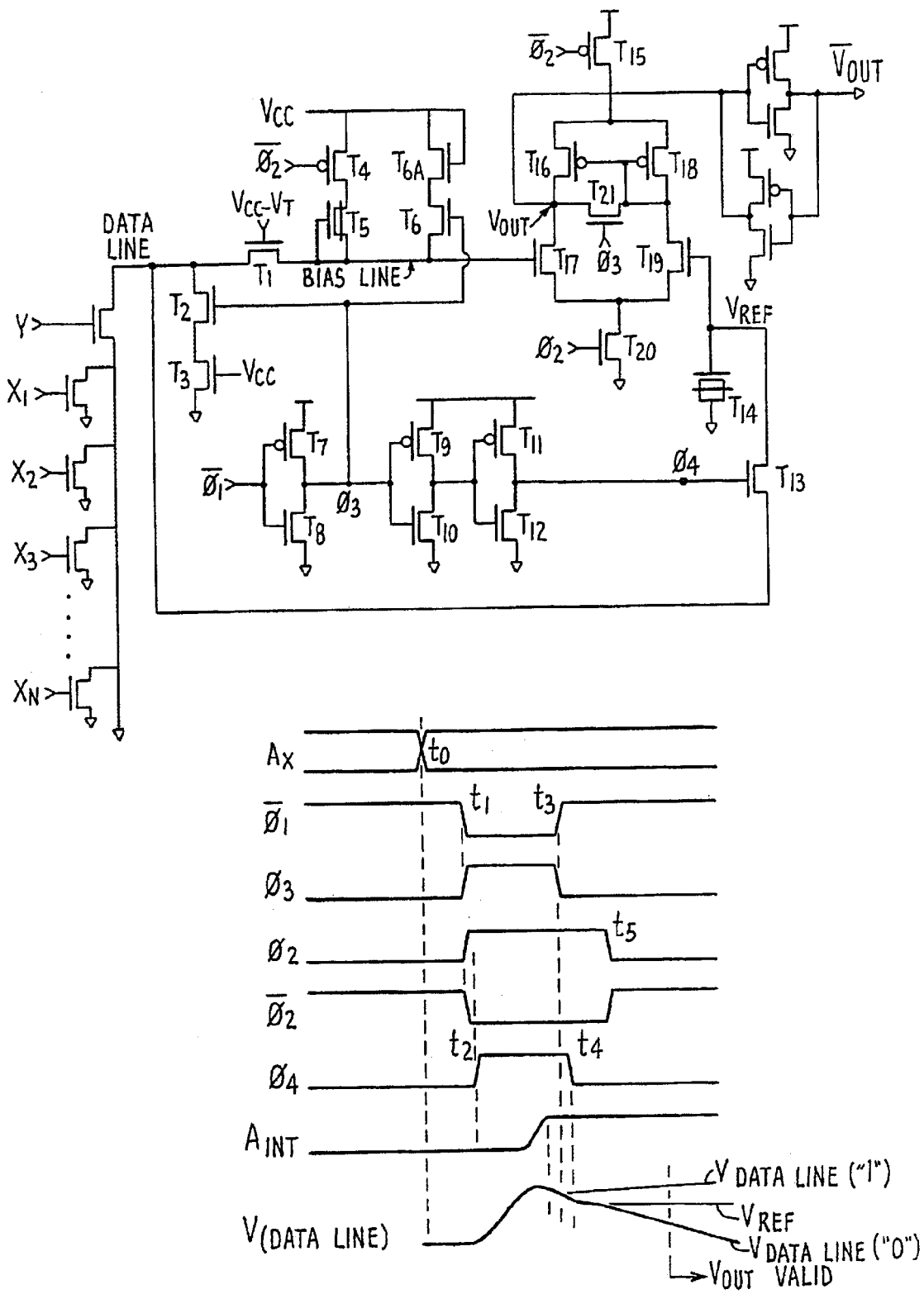
FIG. 3 illustrates a schematic diagram and timing data of a prior art sense amplifier used for detecting a change in a single-ended data line and using a stable reference voltage derived from a data line input.
Figure 4:
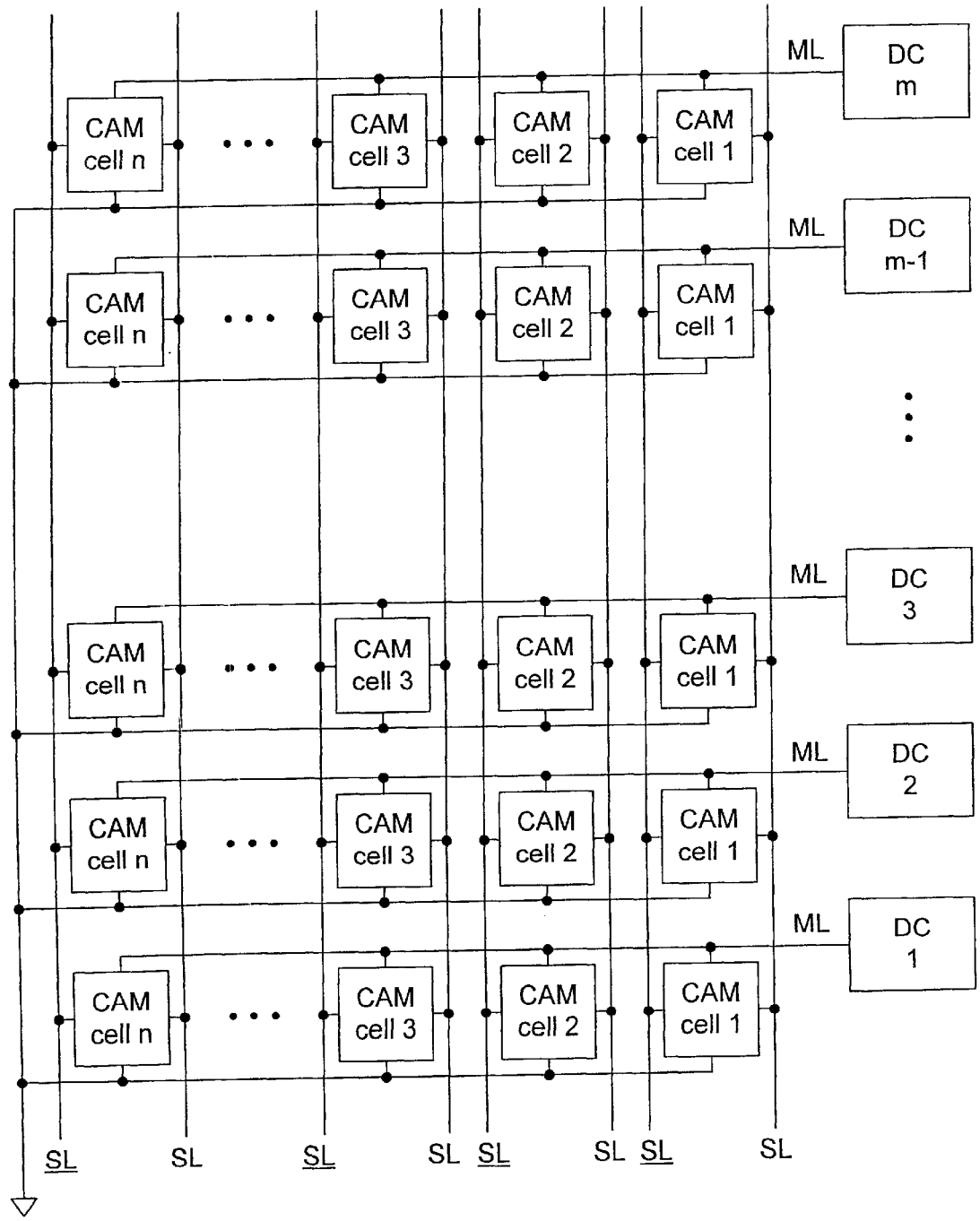
FIG. 4 illustrates in a block diagram, a series of detection circuits typically used for detecting a match or mismatch condition on matchlines each connected to several CAM cells.

FIG. 4 illustrates a block diagram of a series of detection circuits typically used for detecting a match or mismatch condition on matchlines ML wherein each matchline is connected to several CAM cells. The detection circuit DTC is designed to sense a match or mismatch between the search data on searchlines SL and SL/ and data stored in the CAM cells. As previously mentioned, in modem state-of-the-art CAMs, the number n of CAM cells in a row connected to a matchline is typically 128, and therefore, with 128 CAM cells connected to a matchline the capacitance of that matchline is quite significant, typically around 100fF or more depending on the process technology used. In addition, the total number of matchlines m are typically as high as 30,000, all of which have to be sensed simultaneously for modem applications. The large amount of power dissipated by the simultaneous sensing of all these highly capacitive matchlines is an important factor in the design of a CAM and is addressed by the present invention. The detection circuit DTC is the major aspect of the present invention.

Figure 5A:
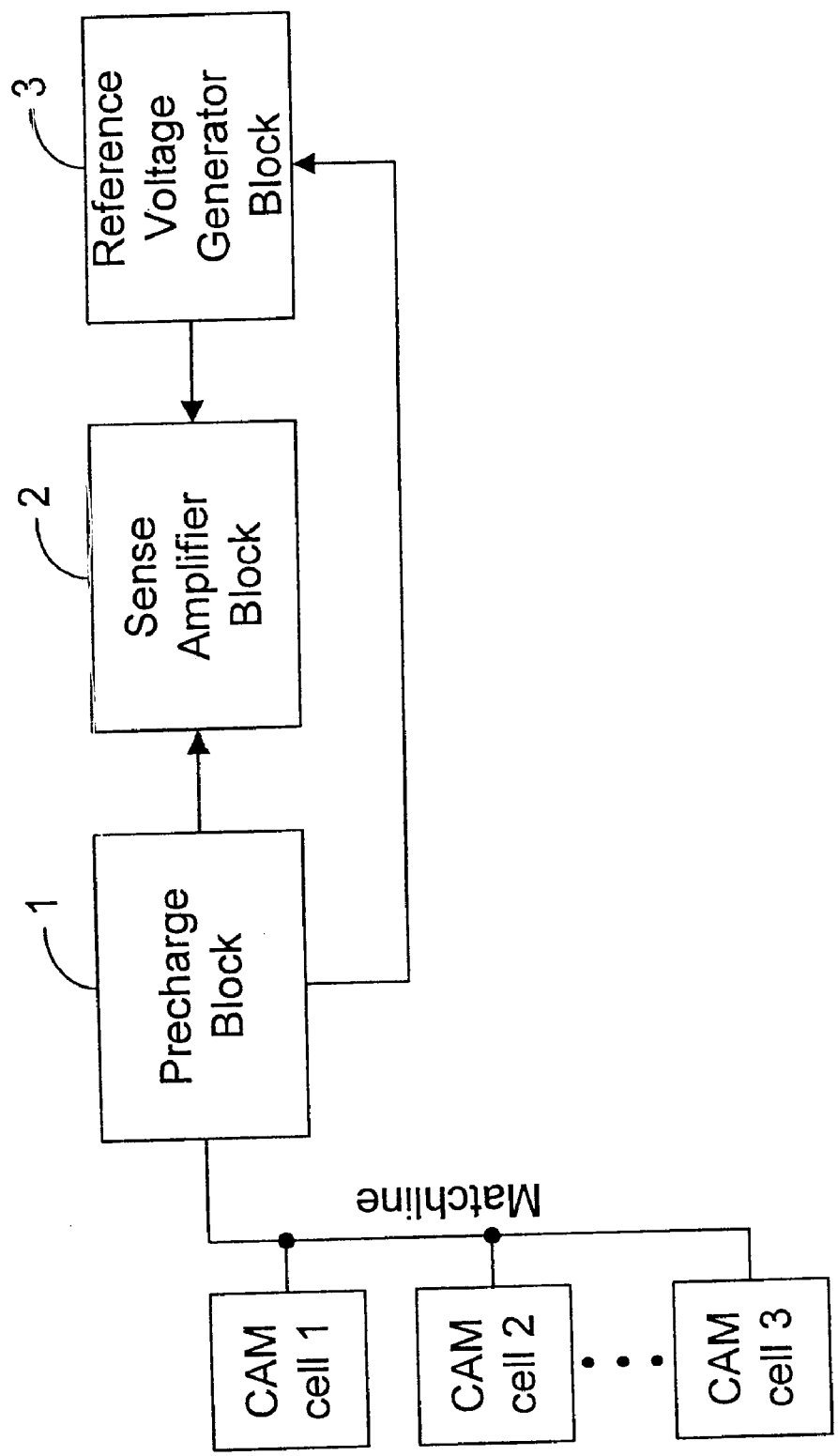
FIGS. 5a and 5b illustrate in a block diagram and a schematic diagram respectively, a matchline sense amplifier in accordance with an embodiment of the present invention.

A preferred embodiment of the detection circuit of the invention for use in CAM applications for detection of a match or mismatch search condition on a high density CAM matchline is illustrated in the block diagram of FIG. 5a. The circuit DTC consists of a precharge block 1, a sense amplifier block 2, and a reference voltage generator block 3. The precharge block 1 is coupled to the matchline signal and provides the precharge voltage to the matchline as well as to the sense amplifier block 2 and the reference voltage generator block 3. The reference voltage generator block 3 provides the reference voltage to the sense amplifier block 2 as will be described in further detail below.

Figures 5, 5B:
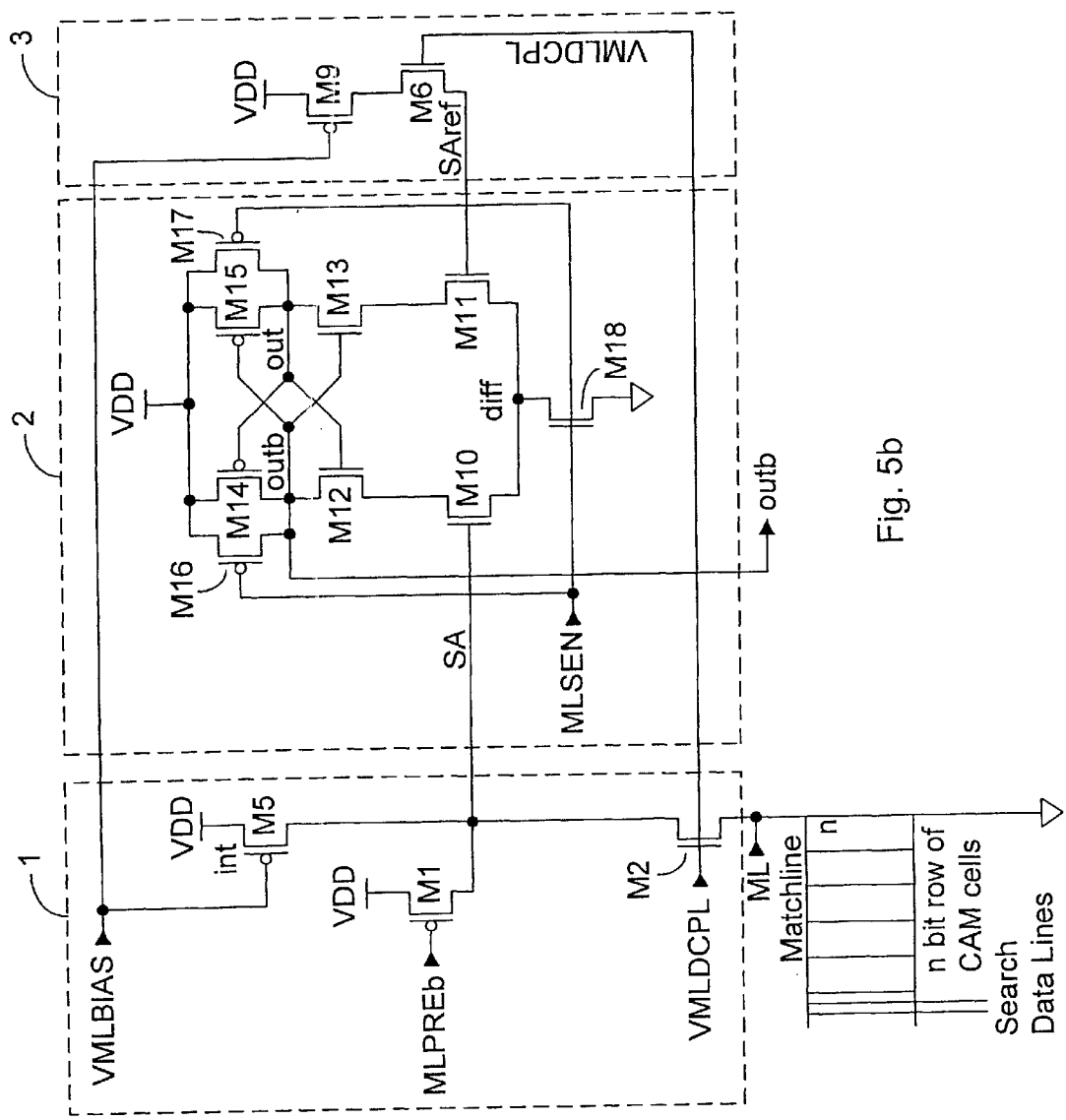

The transistor configuration of FIG. 5b is a detailed implementation of this preferred embodiment of the invention. A typical CAM matchline, designated in FIG. 5b as MATCHLINE, is connected to an input node ML. The input node ML is coupled to a sense node SA via a decoupling transistor M2 which is controlled at its gate by a matchline decoupling voltage VMLDCPL. The sense node SA is precharged by a precharge transistor M1 which is controlled at its gate input by a matchline precharge voltage pulse MLPREb, (which is an active-low signal, i.e. it is activated by bringing the signal to a ground voltage level). The sense node SA is prevented from floating by a biasing transistor M5 which is connected between VDD and node SA. The purpose of the precharge block 1 is to precharge the input node ML prior to a search and compare operation.

The sense amplifier block 2, consisting of transistors M10–M18, is preferably implemented by a differential amplifier (transistors M10, M11, M18) with a latching load (transistors M12–17), a structure which is known to those skilled in the art. Other sensing circuits providing the same function as the preferred differential amplifier can be used as will be readily apparent to the art skilled person. For sake of simplicity of description, not due to their common function, all these circuits will be herein referred to as differential amplifier circuits. A sense enable signal MLSEN is provided to the gates of transistors M18, M16 and M17 for allowing the differential amplifier to alternate between an active sensing phase and a precharge or stand-by phase of operation. The transistors making up the differential pair, M10 and M11, receive at their gates the signals on the sense node SA and on a reference node SAref respectively. The differential amplifier circuit 2 performs the differential sensing operation as will be described below, and is designed to provide little or no DC power dissipation. The power consumed during the latching of a match signal for example, is insignificant, and no power is consumed after the latching has occurred.

The reference voltage generator block 3 consists of two serially connected transistors between VDD and the reference node SAref. The two transistors M9 and M6 provide a bias current required to precharge the reference node SAref. Transistor M9 receives at its gate the bias voltage VMLBIAS which is also provided to the gate of transistor M5 in the precharge block 1. The same matchline decoupling voltage that is provided to the gate of M2 in the precharge block 1 is also provided to the gate of transistor M6 in the reference voltage generator block 3. Transistor M6 is chosen to have similar operating parameters as the decoupling transistor M2 for reasons which will be described in further detail below.

FIG. 5b shows a number of voltage terminals that are used to supply voltage levels to different parts of the sensing circuit. These consist of:
- a first supply terminal VDD—an externally provided or internally generated power supply
- a second supply terminal VSS (ground)
- a pre-selected current-limiting bias voltage VMLBIAS— preferably an on-chip generated reference voltage
- a pre-selected decoupling bias voltage VMLDCPL— preferably an on-chip generated reference voltage whose value is preferably slightly less than VDD
- a sense phase enable control signal MLSEN
- a precharge phase enable control signal MLPREb It should be noted that in the preferred embodiment, the bias voltage VMLBIAS and VMLDCPL are generated on-chip using any conventional voltage-generation method. More specifically, the value of VMLDCPL is preferably set slightly lower than VDD in order to allow extra noise margin in case of matchline voltage fluctuations. Such matchline fluctuations may arise due to charge-sharing between the matchline and junction nodes of the CAM cell transistors associated with that matchline. This charge-sharing may cause the matchline voltage to drop when search data is loaded into the CAM cells. The drop on a matchline connected to an n-bit row of CAM cells will be the final value after charge-sharing occurs between the matchline capacitance and the junction capacitance of n transistors, as a worst case. If VMLDCPL were set to VDD, this would cause the decoupling transistor M2 to turn on for any matchline drop since the gate and the source of the decoupling transistor M2 will both be at a VDD level and since node SA is precharged to VDD. However, if VMLDCPL is set to be below VDD, as in this preferred embodiment, then matchline fluctuations will not be sufficiently large to turn on the decoupling transistor whose gate is below VDD and whose source is at VDD, and which is therefore maintained in an off state. Thus, a lower value of VMLDCPL will provide a greater noise margin. Furthermore, since the matchline ML is never precharged to the full VDD level, but rather to VMLDCPL–Vtn, where Vtn is the gate-to-source threshold voltage of the decoupling transistor M2, a considerable reduction in dynamic power on the matchline is achieved, representing a key aspect of this invention.

The reference voltage generating circuit 3 provides a reference signal on the reference node SAref. The physical size and current-voltage (I–V) characteristics of the precharge-tracking transistor M6 and decoupling transistor M2 are similar in every respect so that when the same voltage VMLDCPL is provided to the gates of both M2 and M6, the voltages on the reference node SAref and the input node ML (and matchline) are at the same level. This unique circuit and component configuration allows the reference voltage on node SAref to self-track any variations due to device mismatches or threshold voltage variation. This is another aspect of the present invention. Transistor M9 provides the bias current necessary to precharge the reference node SAref to the matchline voltage level. The physical sizes of transistors M6 and M9 are designed to generate the required reference voltage level on node SAref within a relatively short time after the search data is loaded into the CAM cells. Furthermore, this active reference generating circuit (M6 and M9) prevents the reference node SAref from floating after the precharge phase, ensuring that noise coupling will not corrupt the reference node SAref during the sensing phase.

The operation of the embodiment of FIG. 5b will now be described also with reference to FIG. 6 which is a general simplified timing diagram showing the precharge and sense phases of operation. Beginning with a precharge phase prior to a search and compare operation, the MLPREb signal supplied to the gate of transistor M1 is pulsed from VDD to VSS, causing the sense node SA to become precharged to VDD. The precharge pulse is relatively short (about 3.5 ns) after which MLPREb returns to VDD, thereby turning off transistor M1. Through the decoupling transistor M2, the input node ML (and therefore the matchline) are also precharged to a voltage level equal to VMLDCPL–Vtn. During this precharge phase, MLSEN is maintained at VSS level, disabling the differential sense amplifier and precharging the single-ended active-low output of the differential amplifier outb to VDD level through transistor M16.

Once MLPREb is returned to VDD level, a search and compare operation begins with search data being loaded onto the search lines SL and SL/ and being compared with the stored data in CAM cells. Assuming a worst-case scenario, where a single bit mismatch occurs in the n-bit row of CAM cells, the input node ML (and matchline) start to discharge from the VMLDCPL–Vtn level towards VSS, causing the decoupling transistor M2 to turn on and node SA to drop below reference node SAref by at least 200 mV. Shortly after this time, MLSEN is driven to VDD in order to enable the differential sense amplifier and latch the data sensed on the gates of the differential pair transistors M10 and M11. Latching of a match or mismatch signal depends on the differential voltage between transistors M10 and M11 when the control signal MLSEN is enabled to VDD level.

During sensing, if a match is detected between the search data and the data in the CAM cells associated with that matchline, the sense node SA remains at VDD since the matchline is not discharging, while reference node SAref is at a voltage threshold level VMLDCPL–Vtn. This condition causes the differential amplifier to pull down the output node outb through transistor M10. This output data is latched in the load of the differential amplifier and can be used further in the output data path (not shown).

On the other hand, if a mismatch is detected between the search data and at least one of the CAM cells associated with the matchline, that matchline voltage immediately starts to discharge to VSS, causing M2 to quickly turn on and the voltage on sense node SA to drop rapidly to the already discharged matchline level which is well below the value of VMLDCPL–Vtn. This rapid drop on node SA, from VDD to below VMLDCPL–Vtn, occurs because of the charge-sharing between the small junction and gate capacitance on sense node SA and the considerably larger matchline capacitance created by the junction capacitance of n CAM cells and wiring capacitance of the matchline. By the time MLSEN is driven to VDD (the beginning of the sensing phase) the sense node SA is discharged well below the reference node SAref. As a result, this change reverses the gate levels on the differential pair M10 and M11 from the match condition, causing the amplifier to pull down node out and leave the single ended output outb at VDD level (i.e. at the precharged level). This output data is latched in the load of the differential amplifier and can be used further in the output data path. The sizes of the latching circuit devices are designed to provide minimum power dissipation and load.

The current limiting transistor M5 is biased to operate in the saturation region by VMLBIAS in order to provide only a very small constant bias current for preventing the sense node SA from floating. It should be noted that the current through the bias transistor M5 flows only briefly during a mismatch condition and is negligible during a match condition. This current through M5 is kept to a minimum so that the pull down current on the matchline due to a worst-case single bit mismatch is able to quickly discharge the matchline ML. Transistor M5 prevents node SA from floating during the match condition as well, since any fluctuation from VDD on node SA will cause M5 to clamp node SA back to VDD. This current limitation through M5 is another key aspect of the invention. In the prior art, no such device is included to prevent the differential input node from floating.

Figure 6:
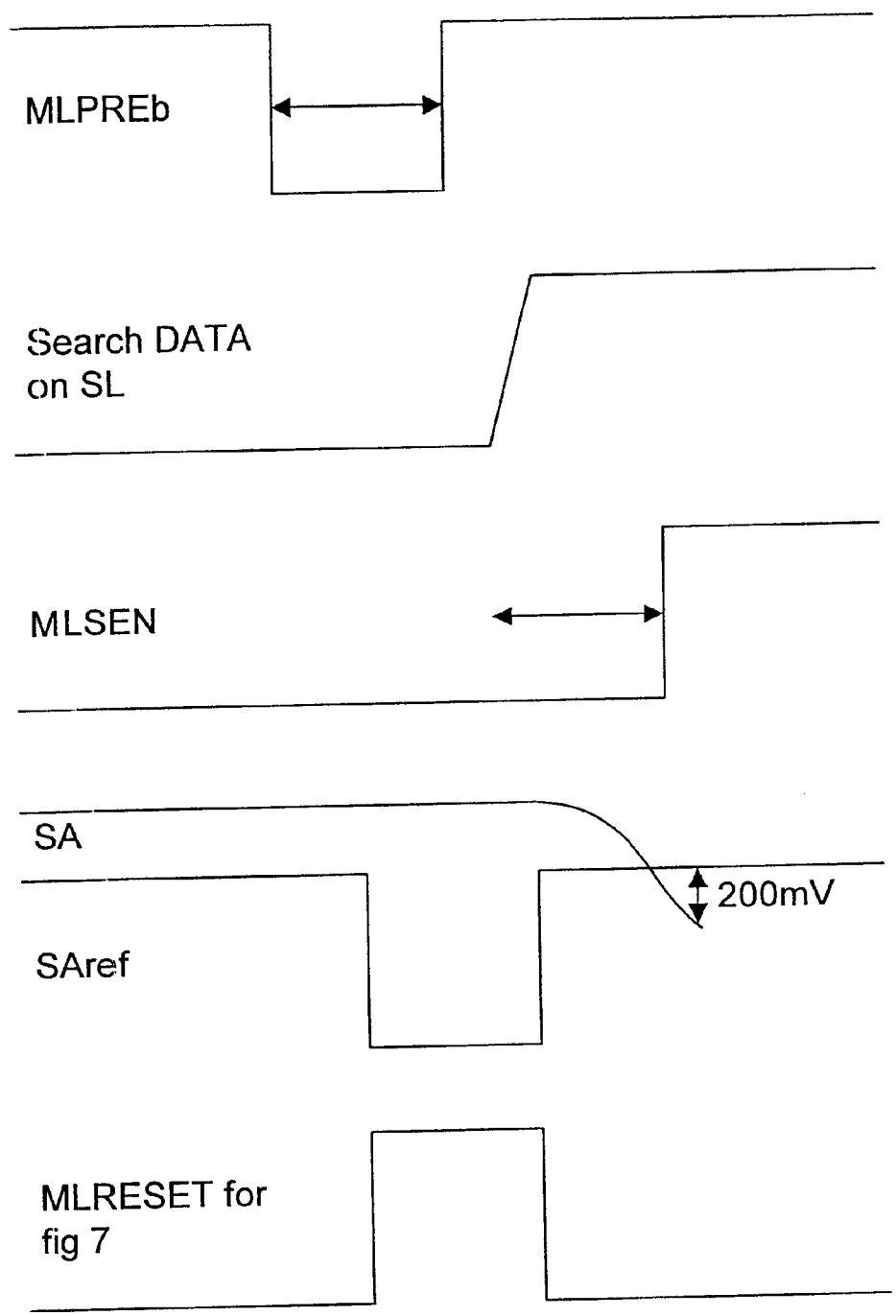
FIG. 6 illustrates in a schematic diagram, an alternative embodiment of the present invention.
Figure 7:
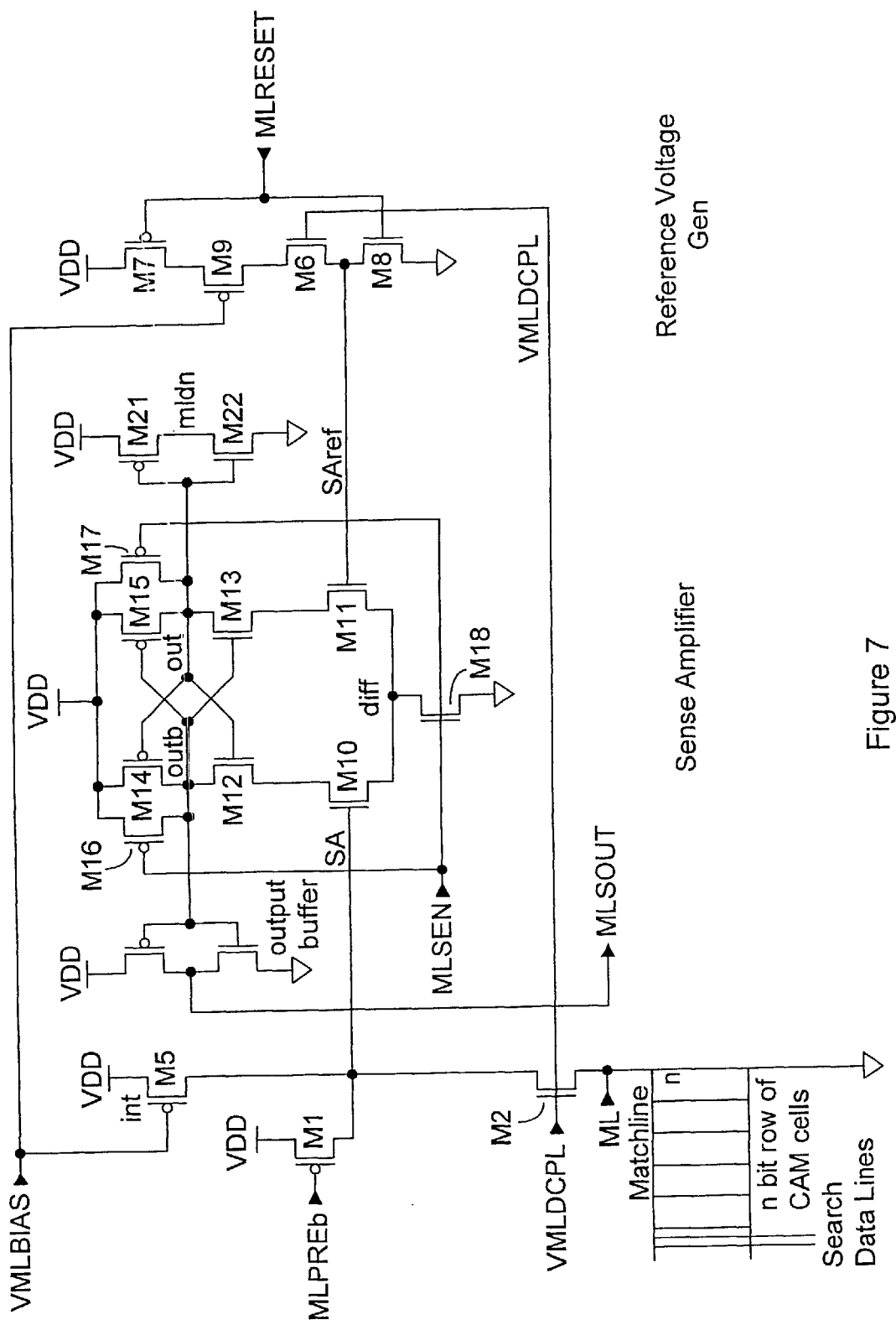
FIG. 7 is a timing diagram illustrating sequence of signals in the search operation of FIG. 5 and FIG. 6.

FIG. 6 shows a second preferred embodiment of the present invention which is a design variation of the embodiment of FIG. 5. This second embodiment contains two additional transistors M7 and M8 that are used to reset the reference voltage by allowing reference node SAref to discharge to VSS during the precharge phase. This is accomplished by setting the voltage MLRESET at the gates of M7 and M8 to VDD during the precharge phase, a feature which removes any unwanted charges on the node. As shown in the timing diagram of FIG. 6, the reset signal MLRESET is pulsed to from VSS to VDD simultaneously with MLPREb being pulsed from VDD to VSS during the precharge phase. Since the search data is not yet loaded at the time MLRESET returns to VSS, there is no conflict in timing between devices M7 and M8 used for the precharge phase and devices M6 and M9 used for the sensing phase. FIG. 7 also contains one inverter driver on each side of the latching circuit. These inverters, consisting of transistors M19 through M22 respectively, are used to isolate nodes outb and out. This additional feature prevents any design mismatch in the latching load devices of the sense amplifier in order to ensure a balanced operation.

Although this invention has been described within the context of content addressable memories, it can be used in many other applications requiring fast, low power single ended sensing schemes, such as Read-only-Memories (ROM's) and Flash Memories.

Of course, numerous variations and adaptations may be made to the particular embodiments of the invention described above, without departing from the spirit and scope of the invention, which is defined in the claims.

What is claimed is:

1. A detection circuit for detecting at an input node a change in an input signal comprising:
   (a) a differential amplifier having a sense node and a reference node;
   (b) means for switching the differential amplifier between a precharge phase and a sense phase;
   (c) precharge means for precharging the input signal with a precharge voltage via an input device, said input device decoupling the sense node and the input signal, wherein a state of the input device is reversed upon said input signal reaching a voltage lower than or equal to a pre-selected precharge voltage; and
   (d) reference means for providing the reference node with a reference signal that continuously tracks the input precharge voltage during the precharge phase and actively maintains the input signal precharge voltage during the sense phase by comparing signals on the sense and reference nodes.

2. A detection circuit as defined in claim 1, for detecting a match or mismatch search condition on a high density content addressable memory matchline wherein the input signal is derived from the matchline.

3. A detection circuit as in claim 2, wherein the input signal is derived from the matchline and said input signal reaching the voltage lower than or equal to the pre-selected precharge voltage represents a mismatch condition.

4. A detection circuit as in claim 1, wherein the precharge means comprises a first bias circuit for biasing the sensing node.

5. A detection circuit as in claim 4, wherein the reference means includes:
   (i) a second bias circuit for biasing the reference node; and
   (ii) a tracking device for stabilizing the reference signal at the input signal precharge voltage during both the precharge phase and the sense phase.

6. A detection circuit as in claim 5, wherein the input device and the tracking device have similar parameters to permit the reference signal to continuously track the input signal precharge voltage during the precharge phase and maintain the input signal precharge voltage during the sense phase.

7. A detection circuit as in claim 5, wherein the first and second bias circuits have dissimilar parameters so as to permit a more rapid voltage change at the sense node than at the reference node during a change in the input signal.

8. A detection circuit as in claim 6, wherein the input device includes a first field effect transistor (FET) having a source-to-drain connection between the sense node and the input node and having a gate responsive to a decoupling bias signal, and wherein the tracking device includes a second FET of similar characteristics to the first FET having a source-to-drain connection between the reference node and an intermediate reference node and a gate responsive to the decoupling bias signal.

9. A detection circuit as in claim 1, further comprising reset means for resetting the reference means during the precharge phase.

10. A detection circuit as in claim 9, wherein the reset means includes a reset transistor having a gate responsive to a reset signal for selectively coupling the reference node to a second power supply terminal during a reset phase.

11. A detection circuit as in claim 1, wherein the differential amplifier comprises first and second outputs, an output precharging circuit for precharging the first and second outputs to an output precharge state, and a latching circuit for switching the first and second outputs between the output precharge state and one of the first and second output states based on the input signal voltage level.

12. A detection circuit as in claim 11, further comprising a first biasing means for preventing the sense node from floating during the sense phase.

13. A detection circuit as in claim 1, wherein the precharge circuit includes limiting means for providing a limited current flow to the sense node during the precharge phase.

14. A detection circuit as in claim 13, wherein the limiting means is turned off while said input signal voltage level remains equal to or greater than the pre-selected precharge voltage.

15. A detection circuit as in claim 14, wherein the limiting means includes a current limiting transistor having a channel positioned between the sense node and a first supply terminal, and a gate responsive to a pre-selected limiter bias voltage suitable to saturate said channel.

16. A detection circuit as defined in claim 1, wherein the detection circuit is implemented within a content addressable memory (CAM) configuration to detect the presence or absence of a match during a compare operation.

17. A method of detecting a change in an input signal comprising the steps of:
   (a) precharging the input signal to an input signal precharge level during a precharge phase;
   (b) decoupling the input signal from a sense amplifier sense node during the precharge phase by an input device;
   (c) generating a reference signal that continuously tracks the input signal precharge level during a precharge phase, and actively maintaining the reference signal at the input signal precharge level during a sense phase;
   (d) deriving a sense signal corresponding to the input signal on the sense node during the sense phase;
   (e) comparing the sense signal with the reference signal;
   (f) reversing a state of the input device upon said input signal reaching a voltage lower than or equal to a pre-selected precharge voltage; and
   (g) switching an output signal between a first state and a second state upon said sense signal reaching a voltage lower than the reference signal.

18. A precharge circuit for precharging a matchline within an array of content addressable memory (CAM) cells powered from first and second power supply terminals, having a predetermined first supply voltage at the first supply terminal relative to the second supply terminal, comprising:
   (a) an input device positioned between the matchline and a sense node; and
   (b) a precharge device for coupling the sense node to the first power supply terminal during a precharge phase, wherein a state of the input device is reversed upon the matchline reaching a voltage lower than or equal to a preselected precharge voltage, and wherein the precharge voltage is lower than the first power supply voltage, all voltages being in absolute values relative to the second power supply terminal.

19. A precharge circuit as in claim 18, wherein the input device comprises a transistor having a gate responsive to a bias signal, and the precharge device comprises a transistor having a gate responsive to a matchline precharge signal.

20. A detection circuit for detecting a match or mismatch search condition on a dynamic content addressable memory (CAM) matchline comprising:
   a) precharge means for precharging the matchline to a predetermined matchline precharge voltage during a precharge phase;

b) reference means for generating a reference voltage which tracks the matchline precharge voltage during the precharge phase and actively maintains the matchline precharge voltage during a sense phase; and c) a differential amplifier for sensing a voltage difference between the reference voltage at a reference node and a sense node voltage at a sense node, wherein a state of an input device coupled between the sense node and the matchline is reversed upon said matchline reaching a voltage lower than or equal to a pre-selected precharge voltage during the sense phase.

21. A detection circuit as in claim 20 wherein the input device and reference means are both controlled by a pre-selected common decoupling voltage.

22. A detection circuit as in claim 21 wherein the matchline precharge voltage is equal to the common decoupling voltage less a pre-selected first threshold.

23. A detection circuit as in claim 22 wherein the first threshold is equal to the threshold voltage of the input device and wherein the input device is a field effect transistor (FET).

24. A detection circuit as in claim 20 wherein the reference means and the input device are comprised of FETs.

25. A detection circuit as in claim 24 wherein the reference means comprises first and second FETs connected in series between a first power supply terminal and the reference node and wherein the second FET is connected to the reference node and the first FET is connected to the first power supply terminal and have substantially identical dimensions and operating characteristics.

26. A detection circuit as in claim 20 wherein the sense node is stabilized from floating to an undetermined voltage level during the precharge phase.

27. A detection circuit as in claim 20 wherein the precharge means is comprised of a first precharge FET connected in between a first power supply terminal and the sense node, and wherein the first precharge FET is controlled by a precharge pulse signal.

28. A detection circuit as in claim 20 wherein the sense node is prevented from floating by a stabilizing FET which is biased to operate in saturation mode and experiences current flow therethrough only in case of a matchline mismatch.

29. A detection circuit as in claim 20 wherein the differential amplifier consumes substantially no power during the precharge phase.

30. A detection circuit as in claim 20 wherein the input device enables charge sharing between a sense node capacitance and a matchline capacitance in case of a matchline mismatch.

31. A detection circuit for detecting a change on an input signal comprising:

a) precharge means for precharging the input signal to a pre-selected precharge voltage during a precharge phase;

b) reference means for generating a reference voltage on a reference node which tracks the precharge voltage during the precharge phase and actively maintains the precharge voltage level during a sense phase;

c) a differential amplifier for sensing a voltage difference between the reference voltage and a sense node voltage coupled to the input signal; and d) an input device connecting said input signal to said sense node, wherein a state of the input device is reversed upon the input signal reaching a voltage lower than or equal to a pre-selected precharge voltage.

32. A detection circuit as in claim 31 wherein the sense node is prevented from floating during the precharge phase and wherein the sense node is also prevented from floating during the sense phase in case a search and compare operation results in a match condition.

33. A detection circuit for detecting a change in an input signal comprising:

(a) a sense amplifier for comparing the voltage of an input node to the voltage of a reference node in a sense phase;

(b) a precharge circuit for precharging the input node to a precharge voltage in a precharge phase;

(c) an input device for decoupling the input node from the input signal during the precharge phase, wherein a state of the input device is reversed upon said input signal reaching a voltage lower than or equal to a pre-selected precharge voltage; and (d) a reference circuit for providing the reference node with a reference signal that continuously tracks the precharge voltage during the precharge phase and actively maintains the input signal precharge voltage during the sense phase by comparing signals on the sense and reference nodes.

34. The detection circuit of claim 33, wherein the sense amplifier includes a differential amplifier.

35. The detection circuit of claim 34, wherein the differential amplifier includes a cross-coupled latch circuit.

36. The detection circuit of claim 33, wherein a sense amplifier enable signal switches the sense amplifier between the precharge phase and the sense phase.

37. The detection circuit of claim 33 wherein the input device includes an n-channel transistor having a gate for receiving a decoupling bias signal.

38. The detection circuit of claim 37, wherein the reference circuit includes a tracking device for stabilizing the reference signal at the input signal precharge voltage during both the precharge phase and the sense phase.

39. The detection circuit of claim 38, wherein the tracking device includes an n-channel transistor having a gate for receiving the decoupling bias signal.

40. The detection circuit of claim 39, wherein the decoupling bias signal voltage is less than the supply voltage.

* * * * *